(12) United States Patent
Urienza

(10) Patent No.: US 9,231,121 B2
(45) Date of Patent: Jan. 5, 2016

(54) HIGH VOLTAGE CIRCUIT LAYOUT STRUCTURE

(71) Applicant: Monolithic Power Systems, Inc., San Jose, CA (US)

(72) Inventor: Joseph Urienza, Milpitas, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 114 days.

(21) Appl. No.: 13/744,273

(22) Filed: Jan. 17, 2013

(65) Prior Publication Data

US 2014/0197515 A1    Jul. 17, 2014

(51) Int. Cl.
*H01L 21/761* (2006.01)
*H01L 29/872* (2006.01)

(52) U.S. Cl.
CPC ............ *H01L 29/872* (2013.01); *H01L 21/761* (2013.01)

(58) Field of Classification Search
None
See application file for complete search history.

(56) References Cited

U.S. PATENT DOCUMENTS

| | | | | |
|---|---|---|---|---|
| 5,270,565 A * | 12/1993 | Lee et al. | ........................ | 257/358 |
| 5,899,714 A * | 5/1999 | Farrenkopf et al. | ........... | 438/202 |
| 6,072,214 A * | 6/2000 | Herzer et al. | ................. | 257/331 |
| 7,882,482 B2 | 2/2011 | Ueunten | | |
| 2002/0017703 A1* | 2/2002 | Kim et al. | ..................... | 257/587 |
| 2002/0125541 A1* | 9/2002 | Korec et al. | ................... | 257/471 |
| 2007/0212823 A1* | 9/2007 | Ren et al. | ...................... | 438/142 |
| 2008/0067588 A1* | 3/2008 | Williams et al. | .............. | 257/343 |
| 2008/0191305 A1* | 8/2008 | Khemka et al. | ............... | 257/481 |
| 2011/0062554 A1 | 3/2011 | Hsing et al. | | |
| 2011/0188218 A1 | 8/2011 | Hsing et al. | | |

* cited by examiner

*Primary Examiner* — Whitney T Moore
*Assistant Examiner* — Scott R Wilson
(74) *Attorney, Agent, or Firm* — Perkins Coie LLP

(57) ABSTRACT

A high voltage circuit layout structure has a P-type substrate; a first N-type tub, a second N-type tub, a third N-type tub, a first P-type tub with a first width and a second P-type tub with a second width formed on the P-type substrate; wherein the first P-type tub is formed between the first N-type tub and the second N-type tub; and the second P-type tub is formed between the second N-type tub and the third N-type tub.

15 Claims, 4 Drawing Sheets

HIGH VOLTAGE CIRCUIT LAYOUT STRUCTURE

TECHNICAL FIELD

The present invention relates to integrated circuits, more particularly, the present invention relates to high voltage circuit layout structure in integrated circuits.

BACKGROUND

Integrated devices or circuits are highly used in modern electrical circuit. High voltage integrated circuits (e.g. high-side gate drivers, high-side power switches, offline sensors, level shifters, etc.) have floating structures. Typically, these high voltage circuits are put on one tub, which also serves as a common reference node.

But sometimes sharing tub is not viable. If the high voltage circuits are not properly isolated from each other, undesirable parasitic device (e.g. minority injection) interaction may occur, which may lead to low efficiency parametric failure or even to worse destructive latch up.

In some cases, isolating the tub in high voltage floating circuits is required so that there is no unintentional interaction with other nearby circuits. But all these tubs need relatively going voltage wise together.

SUMMARY

In one embodiment, a high voltage circuit layout structure comprises (a) a P-type substrate; (b) a first N-type tub, a second N-type tub, and a third N-type tub formed on the P-type substrate; (c) a first P-type tub having a first width formed on the P-type substrate and formed between the first N-type tub and the second N-type tub, the first width being dependent on the punch-through voltage requirement between the first N-type tub and the second N-type tub; and (d) a second P-type tub having a second width formed on the P-type substrate and formed between the second N-type tub and the third N-type tub, the second width being dependent on the punch-through voltage requirement between the second N-type tub and the third N-type tub.

In one embodiment, a high voltage circuit layout structure comprises (a) a P-type substrate; (b) a plurality of N-type tubs formed on the P-type substrate; and (c) at least one P-type tub formed on the P-type substrate and formed between two close-by N-type tubs, the P-type tub having a width with a minimum requirement and a maximum requirement.

The high voltage circuit layout structures discussed above provide tub isolation with proper voltage tracking.

These and other features of the present invention will be readily apparent to persons of ordinary skill in the art upon reading the entirety of this disclosure, which includes the accompanying drawings and claims.

The use of the similar reference label in different drawings indicates the same of like components.

DETAILED DESCRIPTION

Embodiments of circuits for isolation of high voltage floating structures with voltage tracking are described in detail herein. In the following description, some specific details, such as example circuits for these circuit components, are included to provide a thorough understanding of embodiments of the invention. One skilled in relevant art will recognize, however, that the invention can be practiced without one or more specific details, or with other methods, components, materials, etc.

The following embodiments and aspects are illustrated in conjunction with circuits and methods that are meant to be exemplary and illustrative. In various embodiments, the above problem has been reduced or eliminated, while other embodiments are directed to other improvements.

The present invention relates to circuits and methods of high voltage circuit layout structure. N-tubs in the high voltage circuit are isolated by P-type tubs and tub potentials are tracking. Schottky diodes are utilized to shunt out any PN junction that may become a carrier injection source; and the P-tub and P-sub (substrate) are isolated by merged depletion regions.

Figure 1:
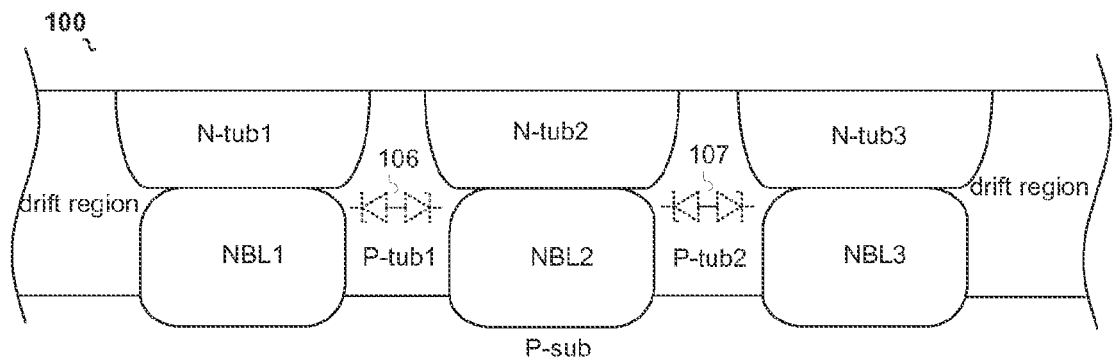
FIG. 1 schematically illustrates a cross section plan view of a high voltage circuit layout structure 100 in a P-type substrate in accordance with an embodiment of the present invention.

FIG. 1 schematically illustrates a cross section plan view of a high voltage circuit layout structure 100 in a P-type substrate in accordance with an embodiment of the present invention. In the example of FIG. 1, the high voltage circuit layout structure 100 comprises: a P-type substrate (P-sub); a plurality of N-type tubs (N-tub1-N-tub3) formed on the P-type substrate; and at least one P-type tub (P-tub1-P-tub2) formed on the P-type substrate and formed between two close-by N-type tubs.

Figure 2:
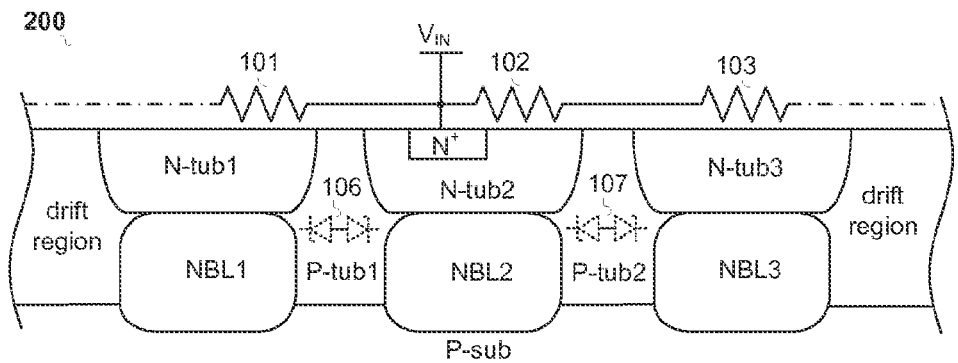
FIG. 2 schematically illustrates a cross section plan view of a high voltage circuit layout structure 200 in a P-type substrate in accordance with an embodiment of the present invention.

FIG. 2 schematically illustrates a cross section plan view of a high voltage circuit layout structure 200 in a P-type substrate in accordance with an embodiment of the present invention. The high voltage circuit layout structure 200 in FIG. 2 is similar to the high voltage circuit layout structure 100 in FIG. 1. Different than the high voltage circuit layout structure 100, the example of the high voltage circuit layout structure 200 in FIG. 2 further comprises a plurality of high sheet poly resistors (101-103), wherein each of the high sheet poly resistors is formed on each of the N-type tubs, and wherein each of the high sheet poly resistors is not connected to the corresponding N-type tub directly.

In the example of FIG. 2, three N-type tubs and three high sheet poly resistors are shown for illustration purpose. However, the high voltage circuit layout structure 200 may contain any desirable number of N-type tubs and high sheet poly resistors.

In one embodiment, the high sheet poly resistor may have a resistance around 100 kΩ.

In the example of FIG. 2, the second N-type tub N-tub2 may be coupled to an external voltage source $V_{IN}$.

In one embodiment, the external voltage source $V_{IN}$ may be at a voltage level of 700V. That is, the second N-type tub N-tub2 may be at a voltage level of 700V.

In one embodiment, the voltage difference between the close-by two N-type tubs may be 20V, and the voltage levels decrease from the N-type tub which is coupled to the external voltage source. That is, the voltage level decreases from the second N-type tub N-tub2, e.g. the second N-type tub N-tub2 may be at a voltage level of 700V, and the first N-type tub N-tub1 and the third N-type tub N-tub3 may be both at a voltage level of 680V.

In one embodiment, each N-type tub connects to the P-type substrate (P-sub) via an N-type buried layer (NBL) respectively, to reduce the resistance and to prevent any punch-through break down between any p-type structures (p-implant or diffusion) that are placed in the overlaying N-tub and the P-sub. Also, the NBL may be utilized to further provide vertical voltage isolation between P-tub and P-sub.

In one embodiment, each of the N-type tubs may contain no circuits/devices inside it. In other embodiments, each of the N-type tubs may contain circuits/devices.

In one embodiment, the P-type tub serves to separate two floating N-tubs. The P-type tub may be desirable to have a minimum width and a maximum width, which are determined by the needed punch-through voltage breakdown separation, which could be emulated schematically as two back-to-back Zener diodes 106 and 107, as shown in dashed lines in FIGS. 1 and 2. That is, the first P-type tub (P-tub1) has a first width which is dependent on the punch-through voltage requirement between the first N-type tub (N-tub1) and the second N-type tub (N-tub2); and the second P-type tub (P-tub2) has a second width which is dependent on the punch-through voltage requirement between the second N-type tub (N-tub2) and the third N-type tub (N-tub3).

In implementation, the exact punch-through voltage is varied with process tolerance. Table 1 shows the P-tub widths (the separation between N-tubs) and the punch-through voltages under a particular process with given N-tub and P-tub doses. As can be seen in Table 1, the wider the P-tub width, the higher the punch-through voltage.

TABLE 1

P-tub width versus Punch-through Voltage

| P-tub Width (μm) | Maximum Punch-through Voltage (V) | Minimum Punch-through Voltage (V) |
| --- | --- | --- |
| 2.5 | short | short |
| 3.0 | 7.8 | 2.5 |
| 3.5 | 15 | 9 |
| 4.0 | 23 | 14 |
| 4.5 | 27 | 18 |

In one embodiment, a lighter N-tub will yield a higher punch-through voltage.

In one embodiment, the NBLs are spaced in a similar manner.

As illustrated hereinbefore, the punch-through voltage is emulated as two back-to-back zener diodes 106 and 107, thus the first N-type tub N-tub1 and the third N-type tub N-tub3 follow relatively with the second N-type tub N-tub2 by punch-through voltages as if these tubs are clamped by back-to-back zener diode 106 and 107. Thus, the N-type tubs are isolated and voltage tracked.

Figure 3:
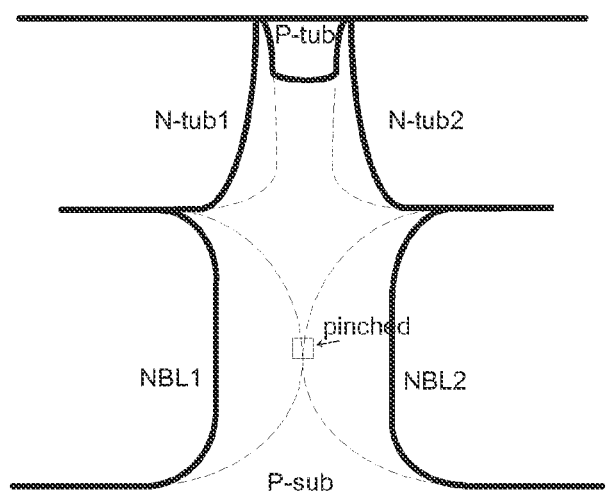
FIG. 3 is a cross section view schematically illustrating the pinching action of depletion regions between tubs shown in FIGS. 1 and 2 in accordance with an embodiment of the present invention.

Meanwhile, the P-type tubs are also isolated from the P-type substrate as the floating structures go high above zero potential. This is due to depletion regions developed between the N-type tubs/NBLs which may get merged. When the voltage difference applied to the high voltage structure and the low voltage structure exceeds to a certain value, there is a pinching action within the P-type regions (P-tub and P-sub). Once the two depletion regions have totally merged or pinched, there becomes an isolation gap between the upper P-type tub and the lower P-type substrate, as shown the dashed lines in FIG. 3. As a result, the P-type tubs and the P-type substrate are isolated. A leftover unpinched P-tub may still exist at near surface.

Figure 4:
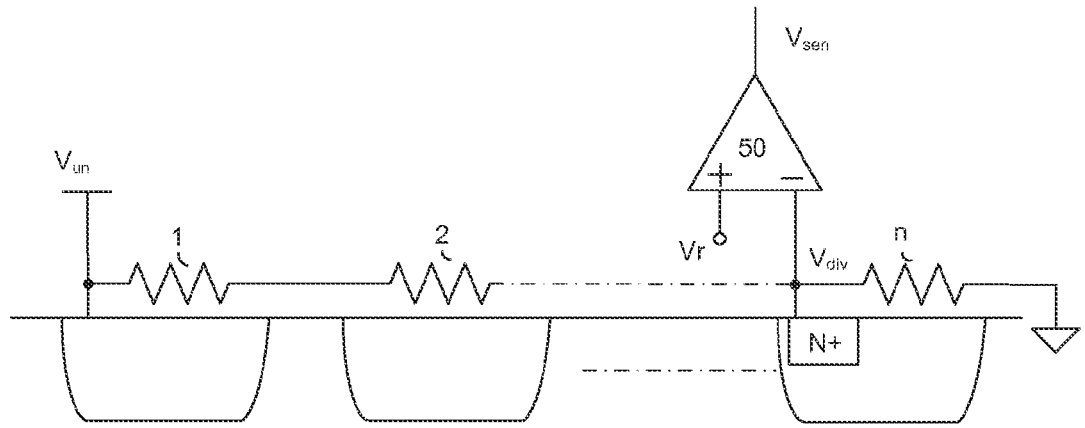
FIG. 4 schematically shows a voltage detecting circuit using high sheet poly resistors to sense an unknown voltage source.

In one embodiment, the high sheet resistors may be used to sense the voltage level of an unknown voltage source, as shown in FIG. 4, which schematically shows a voltage detecting circuit. The voltage detecting circuit comprises an input port configured to receive a voltage source $V_{un}$, which may have a voltage level at an order of hundreds of volts; several tubs formed on a substrate, wherein the voltage source $V_{un}$ is coupled to one of the tubs; several high sheet poly resistors (1-n) coupled in series between the input port and a reference ground, wherein each of the high sheet poly resistors is formed on a corresponding tub but not connected to the corresponding tub directly; and a comparator 50 having a first input terminal coupled to the last high sheet poly resistor n to receive a divided voltage $V_{div}$ indicative of the voltage source $V_{un}$, a second input terminal configured to receive a voltage reference Vr, and an output terminal configure to provide a sensed voltage $V_{sen}$ based on the divided voltage $V_{div}$ and the voltage reference Vr.

In the example of FIG. 4, the high sheet poly resistors are high voltage circuits, while the comparator 50 is a low voltage circuit.

Figure 5:
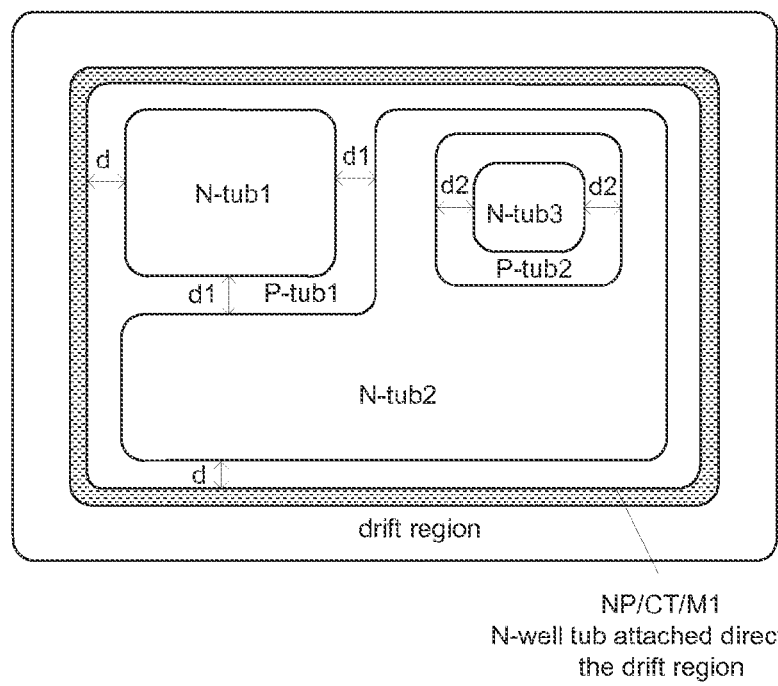
FIG. 5 schematically illustrates a top view of the high voltage circuit layout structure in FIG. 1 in accordance with an embodiment of the present invention.

FIG. 5 schematically illustrates a top view of the high voltage circuit layout structure in FIG. 1 in accordance with an embodiment of the present invention. As shown in FIG. 5, the first N-type tub (N-tub1) and the second N-type tub (N-tub2) are isolated by the first P-type tub (P-tub1) having a first width d1; the second N-type tub (N-tub2) and the third N-type tub (N-tub3) are isolated by the second P-type tub (P-tub2) having a second width d2, wherein the first width d1 is dependent on the punch-through voltage requirement between the first N-type tub (N-tub1) and the second N-type tub (N-tub2); and the second width d2 is dependent on the punch-through voltage requirement between the second N-type tub (N-tub2) and the third N-type tub (N-tub3).

In one embodiment, an N-well tub is attached directly to the drift region, as shown in FIG. 5.

Since the first N-type tub (N-tub1) is the one next to the N-drift region, a band of N-plus (NP), contact (CT) and Metal one (M1) over N-well tub were placed at the borders of N-tub1 and the drift region to set uniform potential between them and avoid intense electric field hot-spot which may cause premature breakdown.

In one embodiment, the drift region comprises a JFET-like N-drift region.

In the example of FIG. 5, the third N-type tub (N-tub3) is surrounded by the second N-type tub (N-tub2).

In the example of FIG. 5, the borders of the first N-type tub (N-tub1) and the second N-type tub (N-tub2) have a same distance d to the drift region. In one embodiment, the distance d may be equal to the first width d1.

Figure 6:
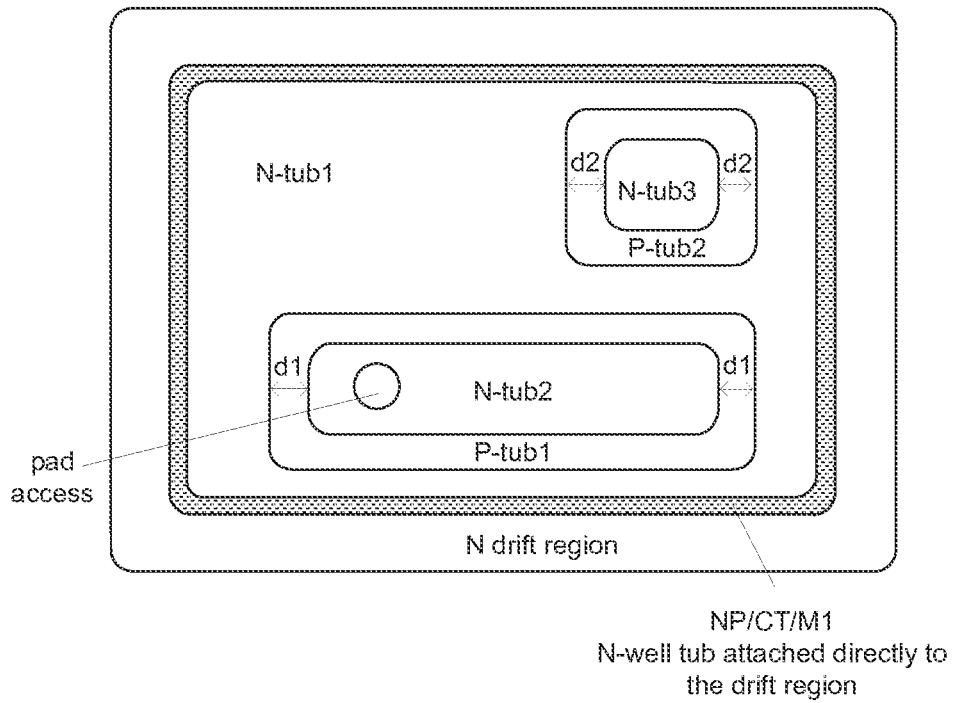
FIG. 6 schematically illustrates a top view of the high voltage circuit layout structure in FIG. 1 in accordance with an embodiment of the present invention.

FIG. 6 schematically illustrates a top view of the high voltage circuit layout structure in FIG. 1 in accordance with an embodiment of the present invention. In the example of FIG. 6, the second N-type tub (N-tub2) and the third N-type tub (N-tub3) are formed in the first tub (N-tub1), the first N-type tub (N-tub1) and the second N-type tub (N-tub2) are isolated by the first P-type tub (P-tub1) having a width of d1, and the first N-type tub (N-tub1) and the third N-type tub (N-tub3) are isolated by the second P-type tub (P-tub2) having a width of d2.

In the example of FIG. 6, the high voltage circuit layout structure further comprises a pad access formed on the second N-type tub (N-tub2) to couple externally.

In one embodiment, the second N-type tub (N-tub2) may have a highest potential among all tubs, while the first N-type tub (N-tub1) may have a lowest potential among these tubs.

Figure 7:
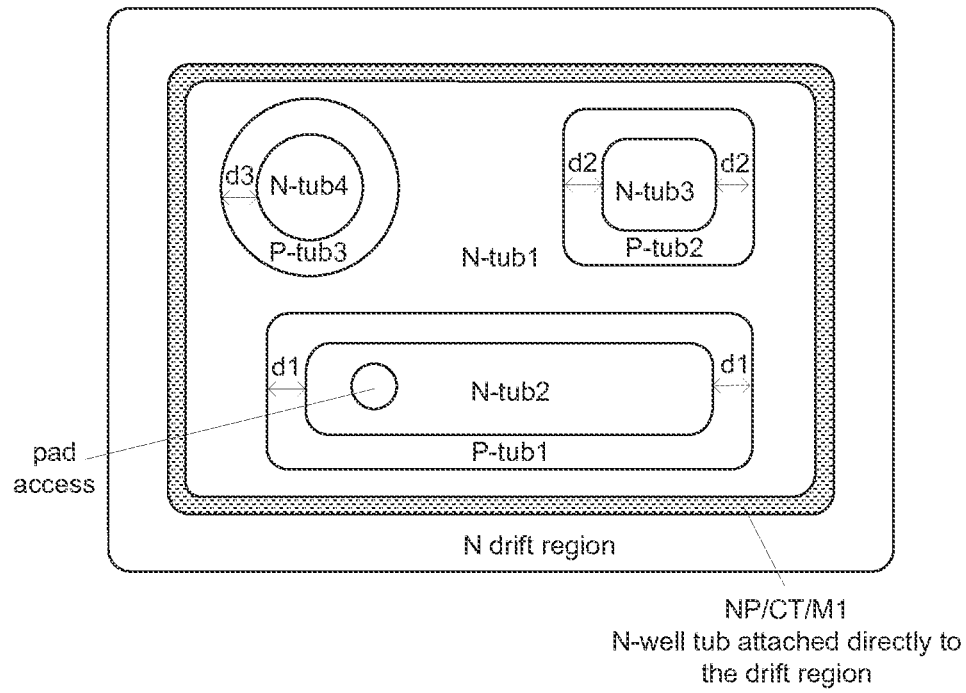
FIG. 7 schematically illustrates a top view of the high voltage circuit layout structure in FIG. 1 in accordance with an embodiment of the present invention.

FIG. 7 schematically illustrates a top view of the high voltage circuit layout structure in FIG. 1 in accordance with an embodiment of the present invention. The high voltage circuit layout structure in FIG. 7 is similar to that in FIG. 6, with a difference that the high voltage circuit layout structure in FIG. 7 further comprises a third P-type tub (P-tub3) and a fourth N-type tub (N-tub4) formed in the first N-type tub (N-tub1), wherein the third P-type tub (P-tub3) and the fourth N-type tub (N-tub4) are in a doughnut shape to provide uniform punch through clamp around the structure; and the first N-type tub (N-tub1) and the fourth N-type tub (N-tub4) is isolated by the third P-type tub (P-tub3) having a third width of d3.

Figure 8:
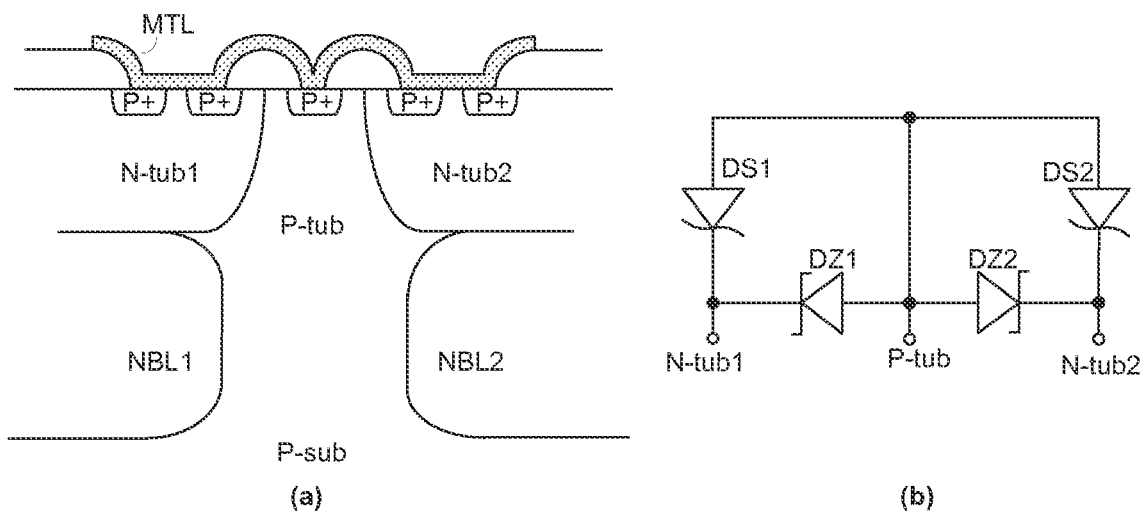
FIG. 8 schematically illustrates a cross section plan view of a high voltage circuit layout structure in a P-type substrate in accordance with an embodiment of the present invention.

FIG. 8a schematically illustrates a cross section plan view of a high voltage circuit layout structure in a P-type substrate in accordance with an embodiment of the present invention, and FIG. 8b schematically shows an equivalent circuit diagram of FIG. 8a. As shown in FIG. 8a, the high voltage circuit layout structure comprises: a P-type substrate (P-sub); a first N-type tub (N-tub1), a second N-type tub (N-tub2) and a P-type tub (P-tub1) formed on the P-type substrate (P-sub), and a metal layer (MTL) contacted with the first N-type tub (N-tub1) and the second N-type tub (N-tub2), wherein the P-type tub (P-tub) is formed between the first N-type tub (N-tub1) and the second N-type tub (N-tub2). The connection between the metal layer (MTL) and the first N-type tub (N-tub1) forms a first Schottky diode DS1, and the connection between the metal layer (MTL) and the second N-type tub (N-tub2) forms a second Schottky diode DS2.

In one embodiment, a lighter doped NWell may replace the NWell in the Schottky diode vicinity. This ensures Schottky connection to the N-tubs.

In one embodiment, in the surfaces of the first N-type tub (N-tub1) and the second N-type tub (N-tub2), there are respectively P-plus (P+) regions formed at the periphery of Schottky diodes to minimize the leakage.

In one embodiment, the P-tub has a P+ region to form an ohmic contact, which is coupled to the anodes of first Schottky diode DS1 and the second Schottky diode DS2, to help to set the potential for the leftover un-depleted P-type tub.

In the example of FIG. 8a, the interface of the P-type tub (P-tub) and the first N-type tub (N-tub1) forms a silicon diode DZ1, and the interface of the P-type tub (P-tub) and the second N-type tub (N-tub2) forms a silicon diode DZ2. As known to one ordinary in the art that the Schottkly diode is a majority carrier device which does not inject any minority. In addition, the Schottky diode has a lower forward drop voltage than any silicon forward-biased diode. As shown in FIG. 8b, the first Schottky diode DS1 is coupled in parallel with the silicon diode DZ1, while the second Schottky diode DS2 is coupled in parallel with the silicon diode DZ2, so the silicon diodes DZ1 and DZ2 are kept from being forward biased. Thus, there is isolation in the high voltage structure area, and the minority injection is avoided.

Several embodiments of the foregoing high voltage circuit layout structure provide tub isolation with proper voltage tracking compared to the conventional technique discussed above. Unlike the conventional technique, several embodiments of the foregoing high voltage circuit layout structure realize tub isolation and voltage tracking between high voltage circuits through appropriate dimension (P-tub width) and self punch-through action. Any higher voltage circuit (in one N-tub) may also serve to provide bias supply to any lower voltage circuit (in other N-tubs) via these punched-through structures. In addition, several embodiments of the foregoing high voltage circuit layout structure utilize low leakage P+ guarded Schottky diode to shunt the parasitic PN diodes (silicon diodes) to eliminate any possible source of injection, to realize isolation and to avoid minority injection. N-buried layers (NBL) are also spaced properly, whose merged depletion regions provide vertical voltage isolation between the P-type tub and the P-type substrate. Furthermore, several embodiments of the foregoing high voltage circuit layout structure adopt an ohmic P+ pickup placed on the floating P-type tub, together with the Schottky diode anodes, which helps to set the potential for the leftover un-depleted P-type tub.

It is to be understood in these letters patent that the meaning of "A" is coupled to "B" is that either A and B are connected to each other as described above, or that, although A and B may not be connected to each other as described above, there is nevertheless a circuit that is connected to both A and B. This circuit may include active or passive circuit elements, where the passive circuit elements may be distributed or lumped-parameter in nature. For example, A may be connected to a circuit element that in turn is connected to B.

This written description uses examples to disclose the invention, including the best mode, and also to enable a person skilled in the art to make and use the invention. The patentable scope of the invention may include other examples that occur to those skilled in the art.

I claim:

1. A high voltage circuit layout structure, comprising:
   a P-type substrate;
   a first N-type tub, a second N-type tub, and a third N-type tub formed on the P-type substrate, wherein the first N-type tub's potential and the third N-type tub's potential follow relatively with the second N-type tub's potential;
   a first P-type tub having a first width formed on the P-type substrate and formed between the first N-type tub and the second N-type tub, the first width being dependent on the punch-through voltage requirement between the first N-type tub and the second N-type tub;
   a second P-type tub having a second width formed on the P-type substrate and formed between the second N-type tub and the third N-type tub, the second width being dependent on the punch-through voltage requirement between the second N-type tub and the third N-type tub; and
   a metal layer contacted with the first N-type tub and the second N-type tub to form a first Schottky diode and a second Schottky diode, and the said metal layer also contacted with the first P-type tub; wherein the first N-type tub and the second N-type tub respectively has P-plus regions in their surfaces.

2. The high voltage circuit layout structure of claim 1, wherein each of the N-type tubs connects to the P-type substrate via an N-type buried layer.

3. The high voltage circuit layout structure of claim 1, further comprising:
   a first high sheet poly resistor formed on the first N-type tub but not connected to the first N-type tub directly;
   a second high sheet poly resistor formed on the second N-type tub but not connected to the second N-type tub directly; and
   a third high sheet poly resistor formed on the third N-type tub but not connected to the third N-type tub directly.

4. The high voltage circuit layout structure of claim 1, further comprising:
   an N-drift region next to the first N-type tub;
   an N-well tub attached to the N-drift region; and
   a band of N-plus, contact and Metal one over the N-well tub placed at the borders of the first N-type tub and the N-drift region.

5. The high voltage circuit layout structure of claim 1, further comprising a third P-type tub and a fourth N-type tub formed in the first N-type tub, the third P-type tub and the fourth N-type tub being in a doughnut shape.

6. The high voltage circuit layout structure of claim 1, wherein the first P-type tub has a P-plus region coupled to anodes of the first Schottky diode and the second Schottky diode to form an ohmic contact, respectively.

7. A high voltage circuit layout structure, comprising:
   a P-type substrate;
   a plurality of N-type tubs formed on the P-type substrate, wherein each of N-type tub's potential relatively follows the adjacent N-type tubs' potential;
   at least one P-type tub formed on the P-type substrate and formed between two close-by N-type tubs, the P-type tub having a width with a minimum requirement and a maximum requirement;
   wherein the plurality of N-type tubs includes a first N-type tub, a second N-type tub and a third N-type tub, each of the first N-type tub, the second N-type tub and the third N-type tub respectively having P-plus regions in their surfaces; and
   a metal layer contacted with the first N-type tub and the second N-type tub to form a first Schottky diode and a second Schottky diode, and the said metal layer also contacted with a first P-type tub formed between the first N-type tub and the second N-type tub.

8. The high voltage circuit layout structure of claim 7, wherein each of the N-type tubs connects to the P-type substrate via an N-type buried layer.

9. The high voltage circuit layout structure of claim 7, further comprising:
   a plurality of high sheet poly resistors, each of the high sheet poly resistors being formed on each of the N-type tubs, and each of the high sheet poly resistors being not connected to the corresponding N-type tub directly.

10. The high voltage circuit layout structure of claim 7, further comprising:
    an N-drift region next to the first N-type tub;
    an N-well tub attached to the N-drift region; and
    a band of N-plus, contact and Metal one over the N-well tub placed at the borders of the first N-type tub and the N-drift region.

11. The high voltage circuit layout structure of claim 7, wherein the third N-type tub is surrounded by the second N-type tub.

12. The high voltage circuit layout structure of claim 7, wherein the second N-type tub and the third N-type tub are formed in the first N-type tub.

13. The high voltage circuit layout structure of claim 7, further comprising a pad access formed on the second N-type tub to couple externally.

14. The high voltage circuit layout structure of claim 7, wherein the first P-type tub has a P-plus region coupled to anodes of the first Schottky diode and the second Schottky diode to form an ohmic contact, respectively.

15. The high voltage circuit layout structure of claim 7, wherein the width of the P-type tub is dependent on the punch-through voltage requirement between the close-by N-type tubs.

* * * * *